(12) United States Patent
Aksin et al.

(10) Patent No.: US 11,262,782 B2
(45) Date of Patent: Mar. 1, 2022

(54) CURRENT MIRROR ARRANGEMENTS WITH SEMI-CASCODING

(71) Applicant: Analog Devices, Inc., Norwood, MA (US)

(72) Inventors: Devrim Aksin, Stokesdale, NC (US); Omid Foroudi, Greensboro, NC (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 16/861,915

(22) Filed: Apr. 29, 2020

(65) Prior Publication Data

US 2021/0341959 A1 Nov. 4, 2021

(51) Int. Cl.
 *G05F 3/26* (2006.01)
 *H03F 3/14* (2006.01)
 *H03M 1/12* (2006.01)
 *H03F 3/345* (2006.01)
(52) U.S. Cl.
 CPC .............. *G05F 3/265* (2013.01); *G05F 3/262* (2013.01); *H03F 3/14* (2013.01); *H03F 3/345* (2013.01); *H03M 1/12* (2013.01); *H03F 2200/555* (2013.01)
(58) Field of Classification Search
 CPC ...................................................... G05F 3/265
 See application file for complete search history.

(56) References Cited

U.S. PATENT DOCUMENTS

| 4,166,971 A | 9/1979 | Schneider |
| 4,237,414 A | 12/1980 | Stein |
| 4,473,780 A * | 9/1984 | Gent ........................ H03F 1/42 315/382 |
| 4,550,284 A | 10/1985 | Sooch |
| 4,583,037 A | 4/1986 | Sooch |

(Continued)

FOREIGN PATENT DOCUMENTS

| WO | 95/32548 | 11/1995 |
| WO | 2018052539 | 3/2018 |

OTHER PUBLICATIONS

*The Cascode Current Mirror*, www.play-hookey.com, Apr. 1, 2020, www.play.hookey.com/analog/current_mirrors/current_mirror_cascode.html, 2 pages.

(Continued)

*Primary Examiner* — Thomas J. Hiltunen
(74) *Attorney, Agent, or Firm* — Patent Capital Group

(57) ABSTRACT

An example current mirror arrangement includes a current mirror circuit, configured to receive an input current signal at an input transistor Q1 and output a mirrored signal at an output transistor Q2. The arrangement further includes a semi-cascoding circuit that includes transistors Q3, Q4, and a two-terminal passive network. The transistor Q3 is coupled to, and forms a cascode with, the output transistor Q2. The transistor Q4 is coupled to the transistor Q3. The base/gate of the transistor Q3 is coupled to a bias voltage Vref, and the base/gate of the transistor Q4 is coupled to a bias voltage Vref1 via the two-terminal passive network. Nonlinearity of the output current from such a current mirror arrangement may be reduced by selecting appropriate impedance of the two-terminal passive network and selecting appropriate bias voltages Vref and Vref1.

26 Claims, 7 Drawing Sheets

(56) References Cited

U.S. PATENT DOCUMENTS

| | | | |
|---|---|---|---|
| 4,983,929 | A | 1/1991 | Real et al. |
| 5,808,508 | A | 9/1998 | Castellucci et al. |
| 5,835,994 | A | 11/1998 | Adams |
| 5,945,873 | A | 8/1999 | Antone et al. |
| 5,966,005 | A | 10/1999 | Fujimori |
| 7,636,016 | B2 | 12/2009 | Russell et al. |
| 8,139,792 | B2 | 3/2012 | Magrath |
| 8,514,023 | B2 * | 8/2013 | Leong ............... H03F 3/16 330/288 |
| 8,575,971 | B1 | 11/2013 | Chamakura |
| 8,791,759 | B2 * | 7/2014 | Darwish ............. H03F 1/34 330/288 |
| 9,874,893 | B2 * | 1/2018 | Ciubotaru ............ G05F 3/26 |
| 2002/0048109 | A1 | 4/2002 | Chaiken et al. |
| 2006/0013982 | A1 | 1/2006 | Malik et al. |
| 2006/0017598 | A1 | 1/2006 | Hales et al. |
| 2006/0181257 | A1 | 8/2006 | Veenstra et al. |
| 2007/0052402 | A1 | 3/2007 | Sirito-Oliver et al. |
| 2009/0085654 | A1 | 4/2009 | Lin |
| 2012/0001613 | A1 | 1/2012 | Larsen et al. |
| 2014/0167859 | A1 | 6/2014 | Bettencourt et al. |
| 2016/0349785 | A1 | 12/2016 | Ciubotaru |

OTHER PUBLICATIONS

Notice of Allowance mailed in TW Patent Application No. 109144622 dated May 18, 2021, 3 pages.
English Translation of Notice of Allowance mailed in TW Patent Application No. 109144622 dated May 18, 2021, 1 page.
Extended European Search Report issued in EP21168262.0 dated Sep. 28, 2021, 17 pages.
*Cascode Amplifiers*, Analog IC Tips, posted May 23, 2014, http://web.archive.org/web/201409281423430/https://www.analogictips.com/cascode-amplifiers/, 4 pages.

* cited by examiner

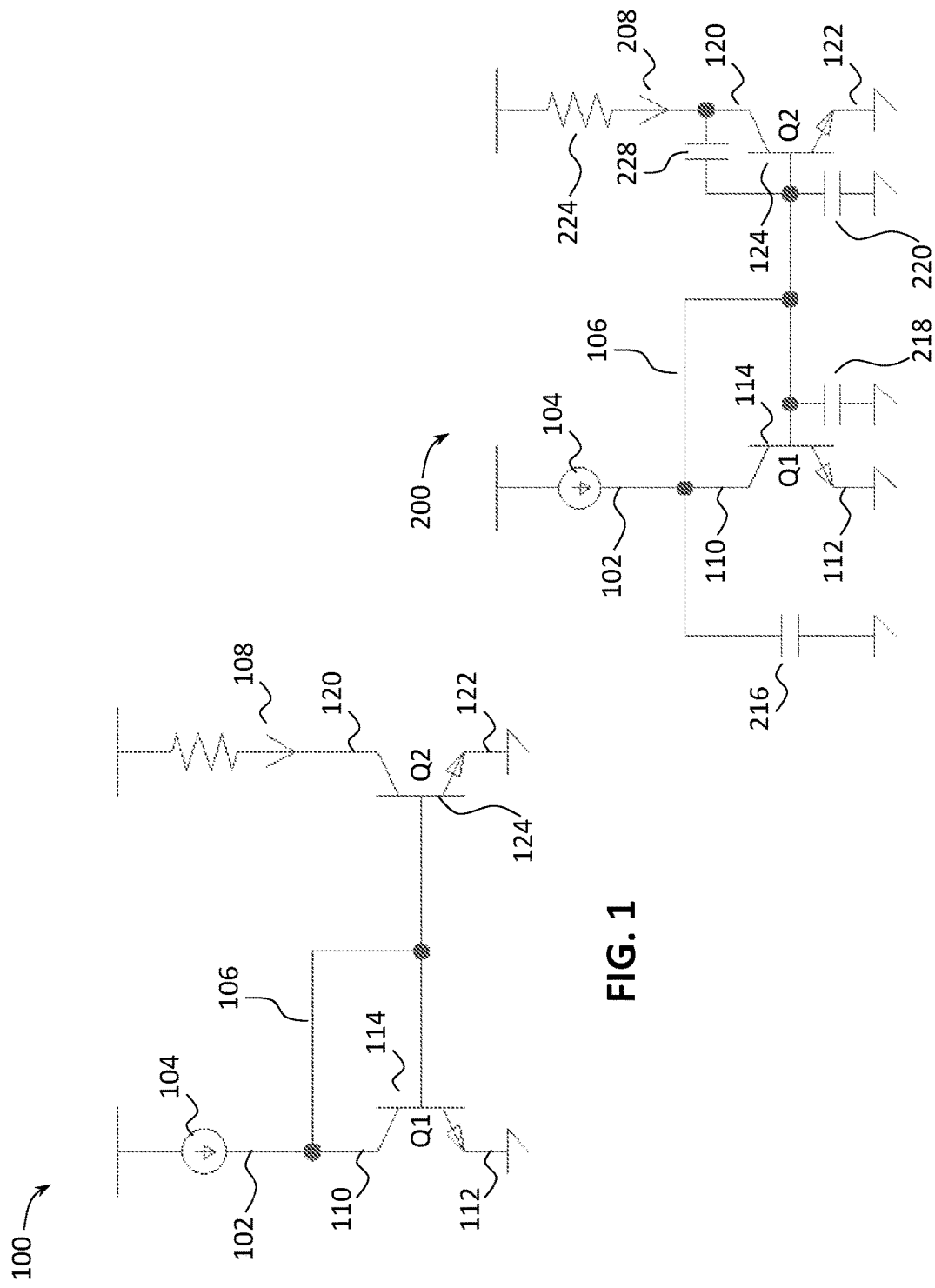

US 11,262,782 B2

CURRENT MIRROR ARRANGEMENTS WITH SEMI-CASCODING

TECHNICAL FIELD OF THE DISCLOSURE

The present disclosure relates generally to electronic devices and, more particularly, to current mirror circuits.

BACKGROUND

Current mirrors are one of the few building blocks that are fundamental to the general circuit designs. In particular, broadband, linear current mirrors are one of the major founding blocks of open loop broadband linear amplifiers utilized within wide range of markets, such as communication, military, automotive, and industrial.

Designing current mirrors that can mirror their input current with a constant current gain to their outputs within a wide operating bandwidth in a linear fashion and in presence of the ever increasing fundamental input signal frequency is not trivial. At a given operating frequency, linearity and signal bandwidth of a current mirror ultimately set an upper bound to the dynamic range of an amplifier, or any other circuit in which a current mirror is used. Classically, linearity is traded off with bandwidth and power. Consequently, having current mirrors that have both high linearity and wide signal bandwidth would provide a significant competitive advantage in differentiating products in a given market.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 1 provides an electric circuit diagram of an NPN implementation of a conventional current mirror with a current gain K;

FIG. 2 provides an electric circuit diagram of an NPN implementation of a current mirror of FIG. 1, additionally illustrating relevant parasitic components for high operating frequencies;

DESCRIPTION OF EXAMPLE EMBODIMENTS OF THE DISCLOSURE

Overview

Figure 3:
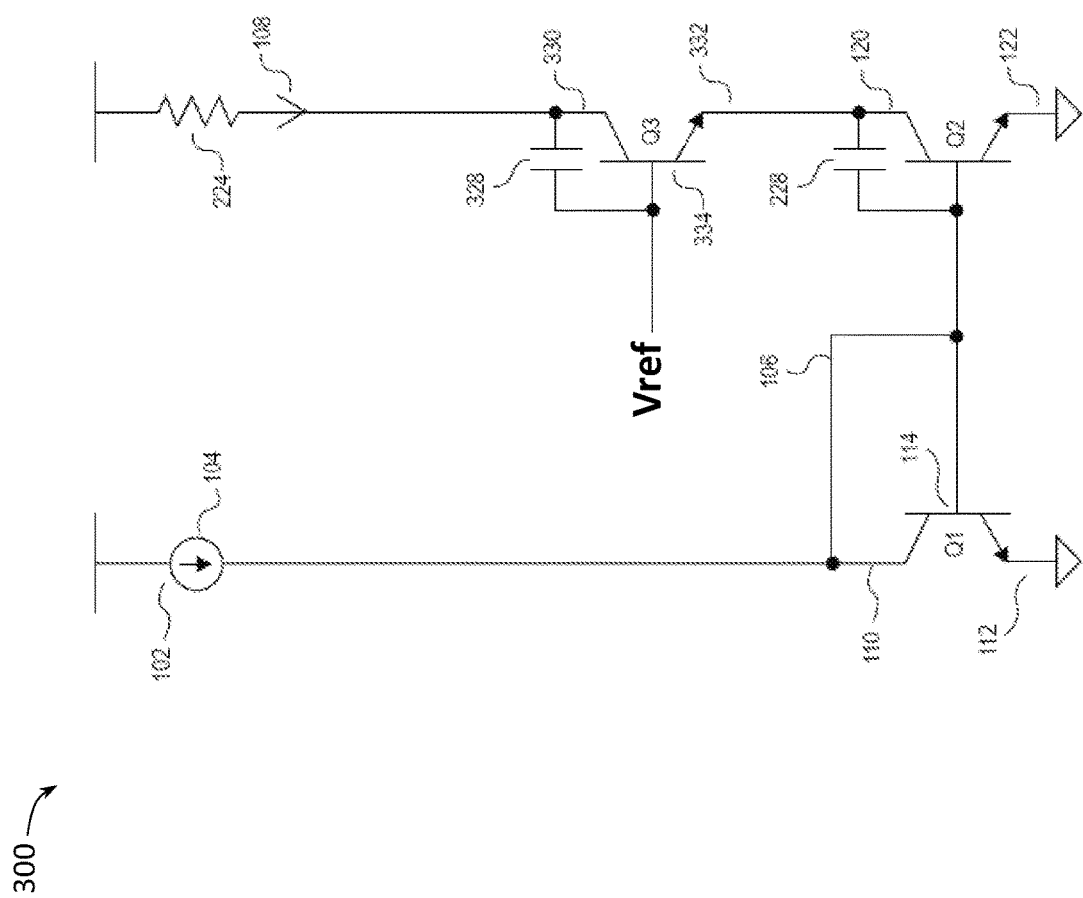
FIG. 3 provides an electric circuit diagram of an NPN implementation of a cascode current mirror.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

In one aspect of the present disclosure, current mirror arrangements with semi-cascoding are described. The exact design of the current mirror arrangements with semi-cascoding may be realized in many different ways, all of which being within the scope of the present disclosure. In one example of design variations according to various embodiments of the present disclosure, a choice can be made, individually for each of the transistors of a current mirror arrangement with semi-cascoding, to employ bipolar transistors (e.g., where various transistors may be NPN or PNP transistors), field-effect transistors (FETs), e.g., metal-oxide-semiconductor (MOS) technology transistors (e.g., where various transistors may be N-type MOS (NMOS) or P-type MOS (PMOS) transistors), or a combination of one or more FETs and one or more bipolar transistors. In view of that, in the following descriptions, transistors are described with reference to their first, second, and third terminals. The term "first terminal" of a transistor is used to refer to a base terminal if the transistor is a bipolar transistor or to a gate terminal if the transistor is a FET, the term "second terminal" of a transistor is used to refer to a collector terminal if the transistor is a bipolar transistor or to a drain terminal if the transistor is a FET, and the term "third terminal" of a transistor is used to refer to an emitter terminal if the transistor is a bipolar transistor or to a source terminal if the transistor is a FET. These terms remain the same irrespective of whether a transistor of a given technology is an N-type transistor (e.g., an NPN transistor if the transistor is a bipolar transistor or an NMOS transistor if the transistor is a FET) or a P-type transistor (e.g., a PNP transistor if the transistor is a bipolar transistor or a PMOS transistor if the transistor is a FET).

In another example of design variations according to various embodiments of the present disclosure, a choice can be made, individually for each of the transistors of a current mirror arrangement with semi-cascoding, as to which transistors are implemented as N-type transistors (e.g., NMOS transistors for the transistors implemented as FETs, or NPN transistors for the transistors implemented as bipolar transistors) and which transistors are implemented as P-type transistors (e.g., PMOS transistors for the transistors implemented as FETs, or PNP transistors for the transistors implemented as bipolar transistors). In yet other examples, in various embodiments, a choice can be made as to what type of transistor architecture to employ. For example, any of the transistors of the current mirror arrangements with semi-cascoding as described herein that are implemented as FETs may be planar transistors or non-planar transistors such as FinFETs, nanowire transistors or nanoribbon transistors. Some example implementations of current mirror arrangements with semi-cascoding are shown in FIGS. 4-7. However, any implementation of the current mirror arrangement with semi-cascoding in line with the descriptions provided herein is within the scope of the present disclosure.

An example arrangement may include a current mirror circuit and a circuit referred to herein as a "semi-cascoding" circuit. The current mirror circuit may include an input transistor Q1 and an output transistor Q2, and may be configured to receive an input signal (e.g., an input current signal, $I_{IN}$) at an input and output a mirrored signal (e.g., a mirrored current signal, IM) at an output, where IM=K*$I_{IN}$, where K is a current gain, which is a positive number greater than 0 (which value may, but does not have to be, an integer). For the bipolar implementation embodiments, the value of K may be indicative of (e.g., be equal to or be based on) a ratio of an area of the emitter of the output transistor Q2 to an area of the emitter of the input transistor Q1. For the FET implementation embodiments, the value of K may be indicative of a ratio of the aspect ratio of the output transistor Q2 to the aspect ratio of the input transistor Q1, where an aspect ratio of a FET transistor may be defined as a channel width of the transistor divided by its' channel length. In the embodiments where K is greater than 0 but less than 1, multiplying by a factor of K means attenuating the current. In the embodiments where K is greater than 1, multiplying by a factor of K means increasing, or gaining, the current. The semi-cascoding circuit may include transistors Q3 and Q4, and a two-terminal passive network (e.g., a resistor). Each of the transistors Q3 and Q4 may be in a common-base configuration if the transistors Q3 and Q4 are bipolar transistors, or in a common-gate configuration if the transistors Q3 and Q4 are FETs. The transistor Q3 may be coupled to, and form a cascode with, the output transistor Q2. The transistor Q4 may be coupled to the transistor Q3. The base/gate of the transistor Q3 may be coupled to a bias voltage Vref, and the base/gate of the transistor Q4 may be coupled to a bias voltage Vref1 via the two-terminal passive network. Nonlinearity of the output current from such a current mirror arrangement may be reduced by selecting appropriate impedance of the two-terminal passive network and selecting appropriate bias voltages Vref and Vref1 for the transistors Q3 and Q4. For example, the impedance of the two-terminal passive network may be selected to be such that the base/gate terminal voltage swing of the transistor Q4 is substantially half of the output swing at the frequency of interest. On the other hand, the bias voltages Vref and Vref1 may be selected to be such that a quiescent voltage between the bias/gate terminal and the output of the transistor Q3 is substantially equal to a quiescent voltage between the bias/gate terminal and the output of the transistor Q4.

Figure 6:
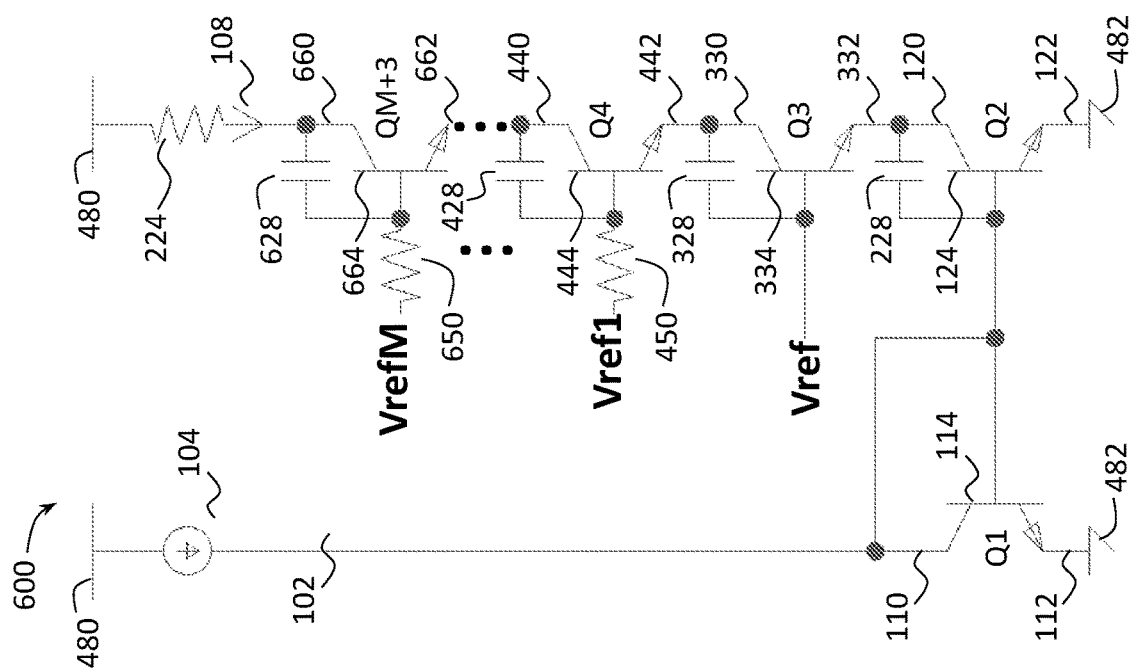
FIG. 6 provides an electric circuit diagram of an NPN implementation of a current mirror arrangement with a plurality of semi-cascoding stages, according to some embodiments of the disclosure.
Figure 7:
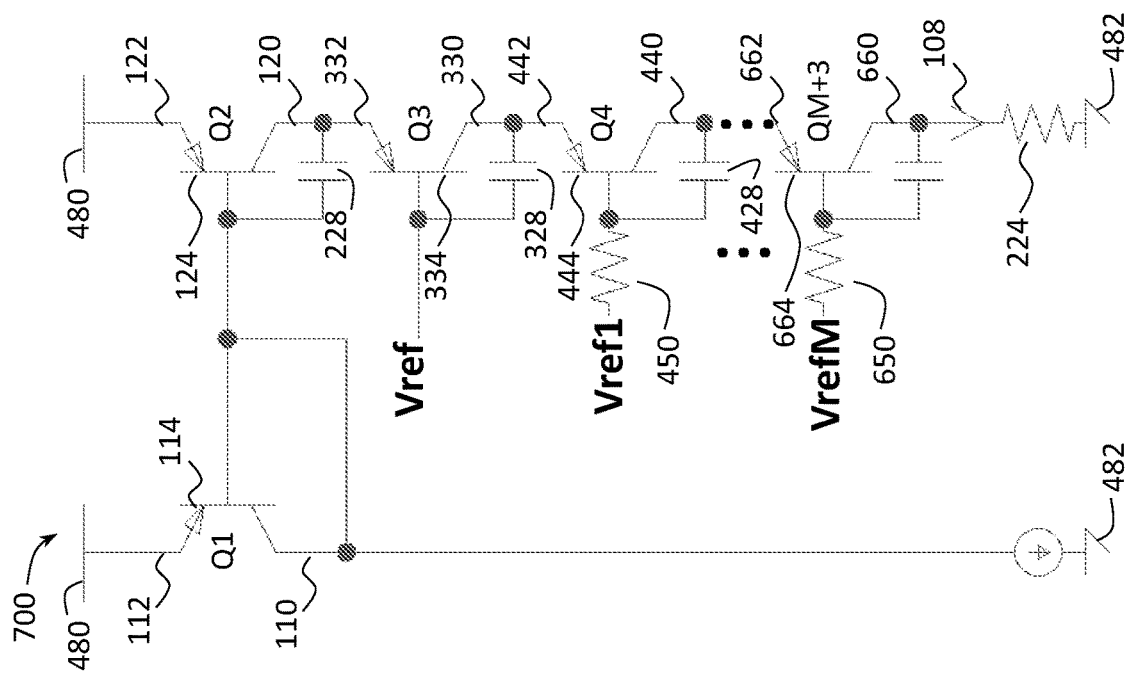
FIG. 7 provides an electric circuit diagram of a PNP implementation of a current mirror arrangement with a plurality of semi-cascoding stages, according to some embodiments of the disclosure.

The term "semi-cascoding" is a term selected to be used in the present disclosure to reflect the fact that the circuit of the transistors Q3, Q4, and the two-terminal passive network, in particular the portion of the circuit that includes the transistor Q4 coupled to the bias voltage Vref1 via the two-terminal passive network, may be seen as being in between having a cascode device and not having any cascode devices. Typically, to implement a cascode device with two transistors (where one transistor is a cascoded transistor and the other transistor is a cascoding transistor), a voltage source is applied directly to the base/gate terminal of the cascoding transistor (i.e., the base/gate voltage of the cascoding transistor is constant). This way, the emitter/source terminal voltage of the cascoding transistor and, consequently, the collector/drain terminal voltage of the cascoded transistor may be kept constant. In contrast, the base/gate voltage of the transistor Q4 described herein is allowed to move up and down based on (i.e., changes depending on) the signal at the output of current mirror arrangement. Subsequently, the emitter/source voltage of the cascoding transistor is also changing with the output signal. Thus, the proposed arrangement is in between having a cascode device (i.e., having a constant base/gate voltage at the cascoding transistor) and not having any cascode device (i.e., the base/gate voltage, and, hence, the emitter/source voltage of the cascoding transistor is moving with the output signal). In line with this, the transistor Q4 having a serial two-terminal passive network coupled to its base/gate terminal may be referred to in the present disclosure as a "semi-cascode stage." In further embodiments, the current mirror arrangement may include a plurality of such semi-cascode stages, e.g., as illustrated in FIGS. 6 and 7.

As will be appreciated by one skilled in the art, aspects of the present disclosure, in particular aspects of current mirror arrangements with semi-cascoding, as described herein, may be embodied in various manners—e.g., as a method or as a system. The following detailed description presents various descriptions of specific certain embodiments. However, the innovations described herein can be embodied in a multitude of different ways, for example, as defined and covered by the claims or select examples. For example, while some of the descriptions are provided herein with respect to either bipolar (e.g., NPN or PNP implementations) or field-effect (e.g., NMOS or PMOS implementations) transistors, further embodiments of the current mirror arrangements described herein may include any combinations of bipolar transistors and FETs.

In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With the numerous examples provided herein, interaction may be described in terms of two, three, four, or more electrical components. However, this has been done for purposes of clarity and example only. It should be appreciated that the devices and systems described herein can be consolidated in any suitable manner. Along similar design alternatives, any of the illustrated components, modules, and elements of the present drawings may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the present drawings and its teachings are readily scalable and can accommodate a large number of components, as well as more complicated or sophisticated arrangements and configurations. Accordingly, the examples provided should not limit the scope or inhibit the broad teachings of the electrical circuits as potentially applied to a myriad of other architectures.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect electrical connection through one or more passive or active intermediary devices/components. In another example, the term "circuit" means one or more passive and/or active components that are arranged to cooperate with one another to provide a desired function. If used, the terms "substantially," "approximately," "about," etc., may be used to generally refer to being within +/−20% of a target value, e.g., within +/−10% of a target value, based on the context of a particular value as described herein or as known in the art. For the purposes of the present disclosure, the phrase "A and/or B" or notation "A/B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A, B, and/or C).

Basics of Current Mirrors

For purposes of illustrating current mirror arrangements with semi-cascoding, proposed herein, it might be useful to first understand phenomena that may come into play when current is mirrored. The following foundational information may be viewed as a basis from which the present disclosure may be properly explained. Such information is offered for purposes of explanation only and, accordingly, should not be construed in any way to limit the broad scope of the present disclosure and its potential applications.

FIG. 1 provides an electric circuit diagram of a simple single-ended NPN bipolar transistor implementation of a current mirror 100 with a current gain of K, as known in the art. As shown in FIG. 1, the current mirror 100 may include a first transistor Q1 (which may be referred to as an "input transistor") and a second transistor Q2 (which may be referred to as an "output transistor"). An input current 102 ($I_{IN}$) (i.e., the current to be mirrored at the output of the current mirror 100 to generate an output current 108) may be provided by an input current source 104. The current mirror 100 may first generate a control voltage (voltage VN1) at a node 106 (node N1) by placing the transistor Q1 in feedback to force the current at a collector terminal 110 (or, simply, "collector" 110) of the transistor Q1 to be equal to the input current 102. An emitter terminal 112 (or, simply, "emitter" 112) of the transistor Q1 may be connected to ground, as shown in FIG. 1. A base terminal 114 (or, simply, "base" 114) of the transistor Q1 may be coupled to a base 124 of the transistor Q2. The base 124 of the output transistor Q2 may be driven with the voltage VN1 carrying the input current information to generate the output current 108. FIG. 1 also indicates a collector 120 of the transistor Q2 and an emitter 122 of the transistor Q2, where the emitter 122 may be coupled to ground and where the output current 108 is the current at the collector 120, as shown in FIG. 1. When the emitter area of the transistor Q2 is K times larger than that of the transistor Q1, the output current 108 ($I_a$) may be equal to $K \cdot I_{IN}$.

The simplified model of a bipolar transistor collector current is given by $$I_C = A * I_S * \exp\left(\frac{V_{BE}}{V_t}\right),$$

where $I_c$, A, $I_S$, $V_{BE}$ and $V_t$ are collector current, emitter area, unit area saturation current, the base-emitter voltage and thermal voltage, respectively. Although the relation between collector current ($I_a$) to base-emitter voltage ($V_{BE}$), or, equivalently input current $I_{IN}$ and VN1, is strongly nonlinear, the input-output current mirroring relation is linear, i.e. $I_O = K \cdot I_{IN}$.

The basic analysis given above has many shortcomings in understanding the performance degradation of current mirrors at high operating frequencies. FIG. 2 provides an electric circuit diagram of an NPN implementation of a current mirror 200. The current mirror 200 is substantially the same as the current mirror circuit 100 of FIG. 1, except that it additionally illustrates relevant parasitic components for high operating frequencies. In other words, FIG. 2 illustrates important parasitic devices that may degrade the bandwidth and the linearity of the circuit 100. It is to be understood that parasitic components shown in the present drawings and discussed herein refer to components which are not deliberately fabricated in a circuit, but, rather, electric circuit diagram representations of inadvertent effects or behavior that may be exhibited by a circuit.

Elements of FIG. 2 having reference numerals shown in FIG. 1 are intended to illustrate the same or analogous elements as those described with respect to FIG. 1, so that, in the interest of brevity, their descriptions are not repeated. This is applicable to other figures of the present disclosure—elements with reference numerals described with reference to one figure may be the same or analogous as elements with the same reference numerals shown in another figure, so that descriptions provided for one figure are applicable to the other figure and don't have to be repeated.

The current mirror 200 may be affected by one of more of a parasitic capacitance 216, a parasitic capacitance 218, a parasitic capacitance 220, a parasitic capacitance 228, and a resistance 224 (which may be used to convert the output current of the current mirror to voltage), each of which coupled as shown in FIG. 2.

The parasitic capacitance 216 may represents all routing parasitic capacitances associated with the node 106, parasitic capacitance of 104 input current source loading node 106, as well as collector-substrate capacitance and extrinsic base terminal parasitic capacitors of the transistors Q1 and Q2. Note that the modern SOI process based bipolar transistor collector-substrate capacitor is relatively small and can be treated as being linear. The parasitic capacitance 218 may represent the intrinsic base-emitter forward-bias diffusion capacitance of the transistor Q1. The parasitic capacitance 220 may represent the intrinsic base-emitter forward-bias diffusion capacitance of the transistor Q2 (and may be K times larger than the parasitic capacitance 218 if the emitter area of the transistor Q2 is K times larger than that of the transistor Q1). The parasitic capacitance 228 may represent the intrinsic base-collector junction parasitic capacitance of the transistor Q2. The resistance 224 may represent an output resistance (RO) of the current mirror 100/200.

Inventors of the present disclosure realized that, as can be seen from the analysis of the circuit in FIG. 2, three distinct mechanisms degrading the bandwidth and/or the linearity of the current mirror may be identified for bipolar transistor implementations. One is bandwidth degradation due to the parasitic capacitors. Another one is linearity degradation due to nonlinearity of the intrinsic base-collector junction parasitic capacitance (e.g., the parasitic capacitance 228, shown in FIG. 2). The third one is linearity degradation due to linear parasitic capacitance 216.

Similarly, a number of linearity degradation mechanisms may be identified for FET implementations of current mirror circuits. One degradation mechanism for the FET implementations is bandwidth degradation due to the parasitic capacitors, similar to the bipolar implementations. Another one is linearity degradation due to linear capacitive load on node 106. The third one is linearity degradation due to gate-drain capacitance $C_{GD}$.

Inventors of the present disclosure further realized that improving on at least some of these degradation mechanisms could provide an improvement in terms of designing linear broadband current mirrors.

A Current Mirror Arrangement a Cascode Device

In general, different techniques may be implemented to improve on one or more of the problems described above, where some tradeoffs may have to be made, e.g., in trading performance with complexity. Embodiments of the present disclosure aim to address the nonlinearity related to the base-collector junction parasitic capacitance of the output transistor Q2, described above. The nonlinear base-collector junction parasitic capacitance can be quite large due to the large quiescent current at the output of the current mirror, common for broadband designs. The base-collector junction parasitic capacitance may convert the output signal swing to a nonlinear current at the output node and load the diode side of the current mirror, hence degrading the overall linearity, as well as also reducing the current mirror bandwidth due to miller effect. Embodiments of the present disclosure are based on recognition that implementing semi-cascoding with one or more semi-cascode stages may provide an improvement with respect to reducing nonlinearity related to the base-collector junction parasitic capacitance.

For high-frequency applications, cascoding technique is utilized primarily to isolate input side of the circuit from the signal disturbance caused by the large swing at its output. This technique may effectively eliminate the miller effect that is loading the node 106 to degrade the mirror's bandwidth as well as its linearity. An example of a cascoding technique is shown in FIG. 3, providing an electric circuit diagram of an NPN implementation of a current mirror arrangement 300 that may be referred to a "cascode current mirror" 300. FIG. 3 illustrates a current mirror formed by the transistors Q1 and Q2, similar to that shown in FIG. 1. FIG. 3 further illustrates an intrinsic base-collector junction parasitic capacitance 228 associated with the transistor Q2, as well as the resistance 224, similar to that shown in FIG. 2. Other parasitic capacitances of FIG. 2 are not shown in FIG. 3 because the focus is now on the base-collector junction parasitic capacitance.

As shown in FIG. 3, in addition to the current mirror formed by transistors Q1 and Q2, the cascode current mirror 300 further includes a transistor Q3. Similar to the transistors Q1 and Q2, the transistor Q3 may be an NPN transistor having a collector 330, an emitter 332, and a base 334. The emitter 332 of the transistor Q3 may be coupled to the collector 120 of the transistor Q2. The collector 330 of the transistor Q3 may be coupled to the output resistance 224, or the output current 108. The base 334 of the transistor Q3 may be coupled to a reference voltage Vref. The transistor Q3 may be used to hold the collector node voltage of the transistor Q2 substantially constant, or, phrased differently, to make the equivalent impedance seen from the transistor Q2 collector terminal to be equal to $1/gm_3$ rather than that of the output resistance 224. FIG. 3 further illustrates a parasitic capacitance 328 associated with the transistor Q3, which is the intrinsic base-collector junction capacitance, similar to the capacitance 228. Thus, the cascode current mirror 300 may include two intrinsic base-collector junction capacitances associated with, respectively, the transistors Q2 and Q3 shown in FIG. 3. In the cascode current mirror 300, the nonlinear current through the intrinsic base-collector junction capacitance of the transistor Q1 is not shown since the signal swing across the intrinsic base-collector junction capacitance of this transistor is substantially equal to zero.

Although the cascode current mirror 300 may provide an improvement in terms of mitigating the miller effect, it does not improve the nonlinear current injected to the output current by the nonlinear reverse-biased capacitance 328 of the transistor Q3. This nonlinear current can limit the achievable linearity, especially for applications where high-frequency signals may need to be generated (e.g., to serve as drive signals for an analog-to-digital converter (ADC)), when the capacitances 228 and 328 and the output swing are large.

Example Current Mirror Arrangements with Semi-Cascodinq

To reduce the nonlinear current at the output that is attributed to the intrinsic base-collector junction capacitances 228 and 328, associated with the transistors Q2 and Q3, embodiments of the present disclosure propose adding one or more semi-cascoding stages to the arrangement shown in FIG. 3. In particular, semi-cascoding arrangements described herein aim to reduce the base-collector junction capacitances non-linear current by effectively reducing the signal swing across these capacitors (e.g., by effectively reducing the signal swing between the base and collector terminals of the transistors Q3 and Q4, shown in FIG. 4). Since the swing on the output node of current mirror arrangements is set by block specifications, the only viable way to reduce the signal swing across the base-collector junction capacitances (e.g., 428 and 328, shown in FIG. 4) is by letting the respective base terminals to swing with the swing on the output node. A first example of this is shown in FIG. 4, providing an electric circuit diagram of an NPN implementation of a current mirror arrangement 400 with a single stage of semi-cascoding, according to some embodiments of the disclosure.

Figure 4:
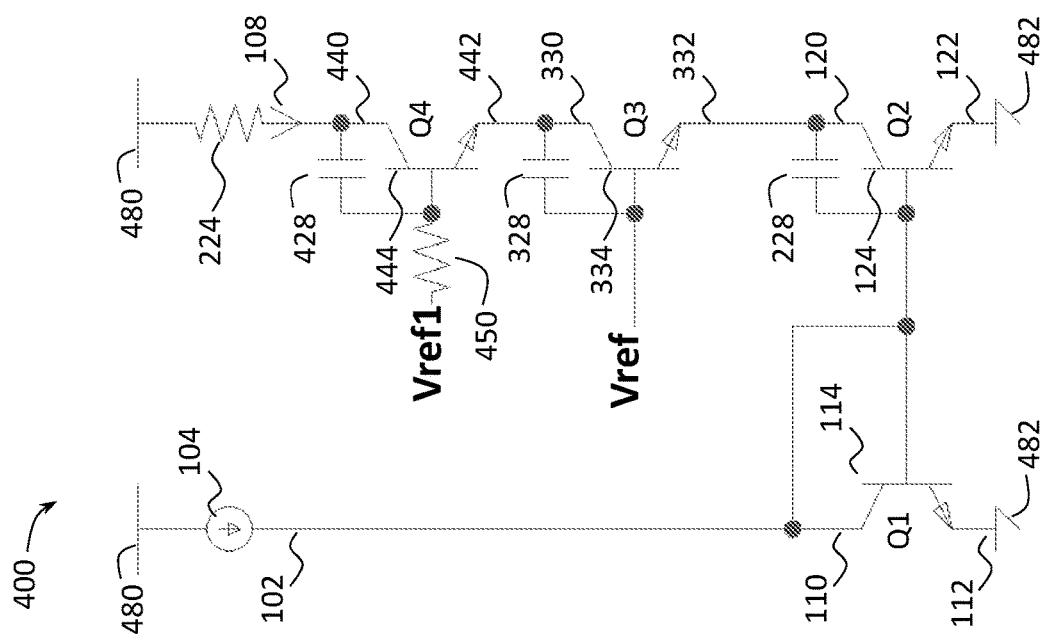
FIG. 4 provides an electric circuit diagram of an NPN implementation of a current mirror arrangement with a single stage of semi-cascoding, according to some embodiments of the disclosure.

The current mirror arrangement 400 includes all of the elements shown in FIG. 3, the description of which are not repeated here in the interests of brevity (FIG. 4 further labels the positive supply for the circuit with a reference numeral 480, and labels the negative supply for the circuit, e.g., ground potential, with a reference numeral 482). In addition, the current mirror arrangement 400 further includes a transistor Q4 having its emitter terminal 442 coupled to the collector terminal 330 of the transistor Q3, and having its base terminal 444 coupled to a bias voltage Vref1 via a resistor 450 (e.g., the base terminal 444 may be coupled to the first terminal of the resistor 450 and the bias voltage Vref1 may be coupled to the second terminal of the resistor 450).

The resistor 450 is an example representation what may, in general, be any other two-terminal passive network. Thus, although the resistor 450 is shown in FIG. 4, in general, the current mirror arrangement 400 may include any other two-terminal passive network 450 that may include one or more passive components such as resistors, capacitors, and inductors. In some embodiments, using a resistor as the two-terminal passive network 450 may be advantageous in terms of reduced complexity. In other embodiments, the two-terminal passive network 450 may include a complex impedance rather than a simple resistor at the base terminal 444 of the transistor Q4 to further extend the linear operating frequency band of the current mirror arrangement 400.

FIG. 4 further illustrates that the collector terminal 440 of the transistor Q4 may be coupled to the output 108 of the current mirror arrangement 400, and further shows a parasitic base-collector junction capacitance 428 that may be associated with the transistor Q4.

Together, the transistors Q3, Q4, and the two-terminal passive network 450 may be seen as a "semi-cascoding arrangement," where the transistor Q4 and the two-terminal passive network 450 is a single stage of the semi-cascoding arrangement. The current mirror arrangement 400 with the semi-cascoding arrangement may operate as follows.

The current mirror arrangement 400 reduces the nonlinear current due to the base-collector junction parasitic capacitances by effectively reducing the signal swing across the parasitic capacitor 428 by virtue of letting the voltage on the base terminal 444 to swing with the voltage at the output of the current mirror arrangement 400 (e.g., the voltage at the resistor 224).

In the arrangement shown in FIG. 4, the transistor Q2 is the cascoded transistor and the transistor Q3 is the cascoding transistor, thus forming a cascode. By having the transistor Q2 be a common-emitter configuration and the transistor Q3 be in a common-base configuration, with the bias voltage Vref coupled to the bias terminal 334 of the transistor Q3, the transistor Q3 may hold the voltage on the collector terminal 120 of the transistor Q2 substantially constant, thereby providing improvements in terms of reducing or eliminating the miller effect, described above.

The bias voltages Vref and Vref1 may be chosen so that the quiescent base-collector voltages of the transistors Q3 and Q4 are substantially equal. Providing such bias voltages Vref and Vref1 can help ensure that the base-collector capacitances 328 and 428 of the transistors Q3 and Q4 are substantially equal.

The impedance of the two-terminal passive network 450 may be chosen so that the base terminal voltage swing of the transistor Q4 is substantially equal to half of the output swing at the frequency of interest. Since the voltage at the emitter terminal 442 of the transistor Q4 will follow its base voltage, the same signal (i.e., substantially half of output swing) appears at the collector terminal 330 of the transistor Q3.

The signal swing across the base-collector capacitors 428 and 328 in such a configuration is half of the one in the cascode current mirror 300 shown in FIG. 3. Hence, the respective third-order nonlinear current decreases by a factor of 8. The total amount of nonlinear base-collector junction capacitance is doubled in the current mirror arrangement 400 of FIG. 4 (because now the transistor Q4 contributes the base-collector junction capacitance 428 as well, in addition to the base-collector junction capacitance 328 of the transistor Q3) compared to the cascode current mirror 300 shown in FIG. 3. Therefore, overall, total third-order nonlinear current due to the base-collector parasitic capacitors in the current mirror arrangement 400 of FIG. 4 may only reduce by a factor of 4, compared to the cascode current mirror 300 shown in FIG. 3. However, a factor of 4 still provides a significant improvement in terms of linearity.

The explanations provided above assumed the base-collector junction parasitic capacitances of the transistors Q3 and Q4 to be equal. However, the semi-cascoding described herein is still valid and reduces total third-order nonlinear current due to base-collector junction parasitic capacitance at the output even if those two base-collector capacitors are not equal, e.g., because of headroom considerations. In such a case, the impedance of the two-terminal passive network 450 may be changed accordingly, but still selected so that the resulting base terminal voltage swing of the transistor Q4 is substantially cancelling the output nonlinear distortion at the frequency of interest.

To summarize the current mirror arrangement 400, the arrangement includes a current mirror circuit formed by an input transistor Q1 at an input of the current mirror circuit and an output transistor Q2 at an output of the current mirror circuit. The arrangement 400 further includes a semi-cascoding arrangement that includes transistors Q3 and Q4, and the two-terminal passive network 450. The transistor Q2 is in a common-emitter configuration, while each of the transistor Q3 and the transistor Q4 is in a common-base configuration. An output of the transistor Q2 is coupled to an input of the transistor Q3, an output of the transistor Q3 is coupled to an input of the transistor Q4, and an output of the transistor Q4 is coupled to an output of the current mirror arrangement. Furthermore, a base terminal of the transistor Q3 is coupled to a bias voltage Vref, a base terminal of the transistor Q4 is coupled to a first terminal of the two-terminal passive network, and a second terminal of the two-terminal passive network is coupled to a bias voltage Vref1. The bias voltage Vref and the bias voltage Vref1 may be selected such that a quiescent voltage between the base terminal and the output of the transistor Q3 is substantially equal to a quiescent voltage between the base terminal and the output of the transistor Q4. The impedance of the two-terminal passive network 450 may be such that a voltage swing at the base terminal of the transistor Q4 is substantially equal to half of a voltage swing at the output of the current mirror arrangement 400 (where the output of the current mirror arrangement 400 may, e.g., be the collector terminal of the transistor Q4) at a given frequency of interest for an input signal to be provided at an input of the current mirror arrangement 400 (where the input of the current mirror arrangement 400 may, e.g., be the collector terminal of the transistor Q1). In this manner, the transistors Q3 and Q4 are configured so that, at a given frequency of interest, the voltage at the base terminal of the transistor Q4 and the voltage at the collector terminal of the transistor Q3 change correspondingly with the change in the voltage at the output of the current mirror arrangement 400.

Figure 5:
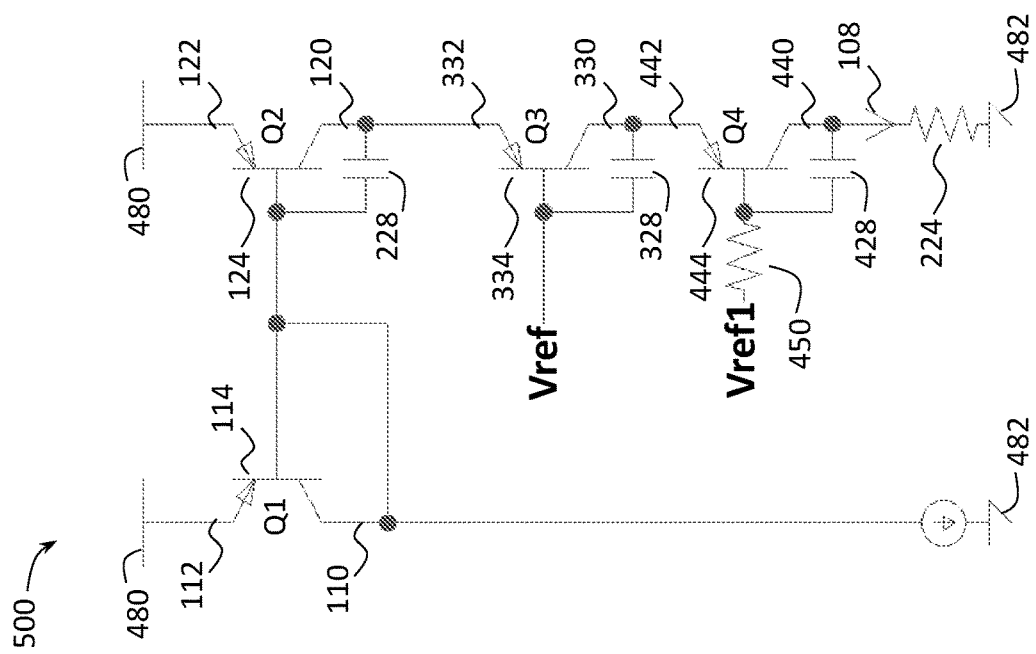
FIG. 5 provides an electric circuit diagram of a PNP implementation of a current mirror arrangement with a single stage of semi-cascoding, according to some embodiments of the disclosure.

While the descriptions of the current mirror arrangement with a single stage of semi-cascoding, provided above, refer to the NPN implementation of the transistors Q1-Q4 (i.e., with all of the transistors Q1-Q4 being implemented as NPN transistors), in other embodiments, the transistors Q1-Q4 of the current mirror arrangement 400 may be implemented as PNP transistors. FIG. 5 provides an electric circuit diagram of a PNP implementation of a current mirror arrangement 500 with a single stage of semi-cascoding, according to some embodiments of the disclosure. The current mirror arrangement 500 is substantially analogous to the current mirror arrangement 400 except that each NPN transistor of the current mirror arrangement 400 is replaced with a PNP transistor in the current mirror arrangement 500, and the positive and negative supplies 480, 482 are swapped. In such a configuration, the descriptions provided with reference to FIG. 4 are applicable to the current mirror arrangement 500 except that NPN and PNP transistors are swapped, and supply and current directions are reversed. The designations such as "first/base terminals," "second/collector terminals," and "third/emitter terminals" remain the same. In the interests of brevity, a detailed description of FIG. 5 is not provided because it's substantially analogous to that of FIG. 4 except for the changes identified above.

It is possible to generalize the semi-cascoding approach described above to cascoding M stages to further reduce the total third-order nonlinear current at the output by a factor of $M^2$.

FIG. 6 provides an electric circuit diagram of an NPN implementation of a current mirror arrangement 600 with a plurality of semi-cascoding stages, according to some embodiments of the disclosure.

The current mirror arrangement 600 includes all of the elements shown in FIG. 4, the description of which are not repeated here in the interests of brevity. In contrast to the arrangement of FIG. 4 that only included a single semi-cascoding stage of the transistor Q4 and the two-terminal passive network 450, the current mirror arrangement 600 includes M such semi-cascoding stages, where M may be any integer greater than 1. The first semi-cascoding stage of the current mirror arrangement 600 includes the transistor Q4 and the two-terminal passive network 450. Then FIG. 6 illustrates two columns of 3 dots each, illustrating that additional semi-cascoding stages may be included there, each of which is substantially the same as the first semi-cascoding stage. FIG. 6 further illustrates the last, Mth, semi-cascoding stage that includes the transistor QM+3 and the two-terminal passive network 650. The notation "M+3" in the transistor of the Mth semi-cascoding stage indicates that, e.g., if the current mirror arrangement 600 included 2 semi-cascoding stages, i.e., M=2, the transistor of the last stage would be a transistor Q5 (i.e., M+3=2+3=5) or that, e.g., if the current mirror arrangement 600 included 3 semi-cascoding stages, i.e., M=3, the transistor of the last stage would be a transistor Q6 (i.e., M+3=3+3=6), and so on. The transistor Q in each of the M semi-cascoding stages may be substantially the same as the transistor Q3 of the first semi-cascoding stage, and the two-terminal passive network in each of the M semi-cascoding stages may be substantially the same as the two-terminal passive network 450 of the first semi-cascoding stage, except for the differences described below.

Consider that i is a variable identifying a given semi-cascoding stage of the current mirror arrangement 600, i.e., i is a an integer equal to or greater than 1 and equal to or less than M. Then for i=1 (i.e., for the first semi-cascoding stage of the current mirror arrangement 600), the transistor of the stage i (i.e., of the stage 1) is the transistor Q4 and the two-terminal passive network of the stage i (i.e., of the stage 1) is the two-terminal passive network 450. For i>1, the base terminal of the transistor Qi of the stage i is coupled to the first terminal of the two-terminal passive network of the stage i, the second terminal of the two-terminal passive network of the stage i is coupled to a respective bias voltage Vrefi of the stage i, and the emitter terminal of the transistor Qi of the stage i is coupled to the collector terminal of the transistor Qi−1 of the stage i−1. Furthermore, for i<M, the collector terminal of the transistor Qi of the stage i is coupled to the emitter terminal of the transistor Qi+1 of the stage i+1, and the collector terminal of the transistor QM+3 of the stage M is coupled to an output of the current mirror arrangement 600. In such an arrangement, for any i that is between 1 and M (including i=1 and i=M), an impedance of the two-terminal passive network of the stage i is such that a voltage swing at the base terminal of the transistor Qi of the stage i is substantially equal to i×VO/(M+1), where VO is a voltage swing at an output of the current mirror arrangement 600 at a given frequency of interest for an input signal to be provided at an input of the current mirror arrangement. In some embodiments, the respective bias voltages of different cascoding stages could be such that the quiescent base-collector voltages of the transistors of different stages are equal.

While the descriptions of the current mirror arrangement with a plurality of semi-cascoding stages, provided above, refer to the NPN implementation of the transistors of the current mirror circuit and the transistors of the semi-cascoding arrangement (i.e., with all of the transistors Q1-QM+3 being implemented as NPN transistors), in other embodiments, the transistors of the current mirror arrangement 600 may be implemented as PNP transistors. FIG. 7 provides an electric circuit diagram of a PNP implementation of a current mirror arrangement 700 with a plurality of semi-cascoding stages, according to some embodiments of the disclosure. The current mirror arrangement 700 is substantially analogous to the current mirror arrangement 600 except that each NPN transistor of the current mirror arrangement 600 is replaced with a PNP transistor in the current mirror arrangement 700, and the positive and negative supplies 480, 482 are swapped. In such a configuration, the descriptions provided with reference to FIG. 6 are applicable to the current mirror arrangement 700 except that NPN and PNP transistors are swapped, and supply and current directions are reversed. The designations such as "first/base terminals," "second/collector terminals," and "third/emitter terminals" remain the same. In the interests of brevity, a detailed description of FIG. 7 is not provided because it's substantially analogous to that of FIG. 6 except for the changes identified above.

Variations and Implementations

While the descriptions provided above refer to the bipolar implementation of the transistors, in other embodiments, any of the current mirror arrangements with semi-cascoding as described herein may include FETs. In particular, in further embodiments of any of the current mirror arrangements with semi-cascoding as described herein, each NPN transistor may be replaced with an NMOS transistor and each PNP transistor may be replaced with a PMOS transistor. In such embodiments, the descriptions provided above with reference to the drawings with bipolar transistors are applicable except that the "first terminals" or "base terminals" of the bipolar transistors become "gate terminals" for the FETs, the "second terminals" or "collector terminals" of the bipolar transistors become "drain terminals" for the FETs, and the "third terminals" or "emitter terminals" of the bipolar transistors become "source terminals" for the FETs.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure related to current mirror arrangements with semi-cascoding may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of current mirror arrangements with semi-cascoding, proposed herein, may be implemented in one or more silicon cores in Application Specific Integrated Circuits (ASICs), Field Programmable Gate Arrays (FPGAs), and other semiconductor chips.

Example Systems with Current Mirror Arrangements with Semi-Cascodinq

Figure 8:
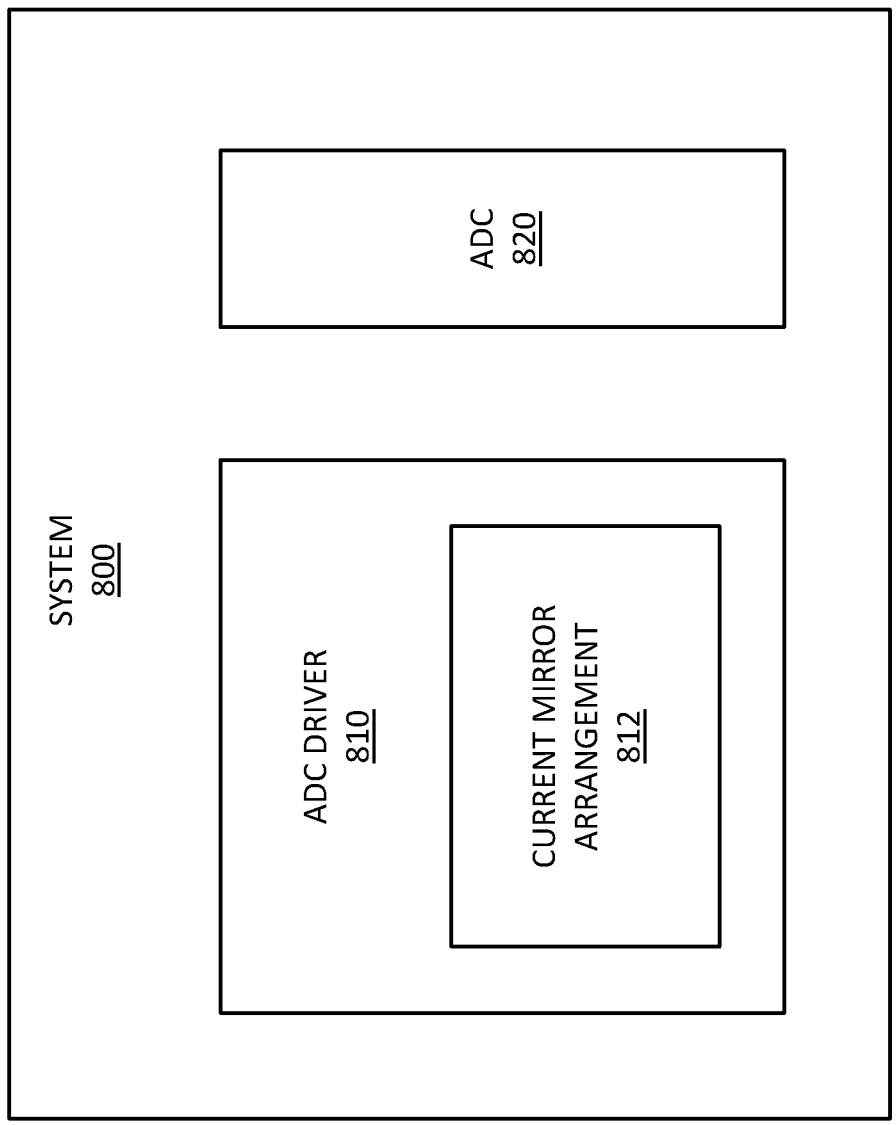
FIG. 8 provides a schematic illustration of a system in which current mirror arrangements with semi-cascoding may be implemented, according to some embodiments of the disclosure.

Various embodiments of current mirror arrangements with semi-cascoding as described above may be implemented in any kind of system where current mirroring may be used. Such current mirror arrangements may be particularly useful in systems where current mirrors having both high linearity and wide signal bandwidth are needed. One example of such a system is shown in FIG. 8, providing a schematic illustration of a system 800 implementing a current mirror arrangement 812, according to some embodiments of the disclosure. As shown in FIG. 8, the system 800 may include an ADC driver 810 and an ADC 820. The ADC driver 810 may be used to provide drive signals to drive the ADC 820 so that the ADC 820 can translate analog electrical signals to digital form, e.g., for data processing purposes. In particular, the ADC driver 810 may include the current mirror arrangement 812 which can be implemented according to any embodiments of current mirror arrangements with semi-cascoding, described above. For example, the current mirror arrangement 812 may be implemented as the current mirror arrangement 400, 500, 600, or 700, or as any further embodiments of these current mirror arrangements, as described above. The ADC driver 810 may then generate drive signals based on the output signal(s) generated by the current mirror arrangement 812. In various embodiments, the drive signals generated by the ADC driver 810 may be used to drive a single or dual differential input of the ADC 820.

In various embodiments, the drive signal generated by the ADC driver 810 may realize/implement functions such as buffering, amplitude scaling, single-ended-to-differential and differential-to-single-ended conversion, common-mode offset adjustment, and filtering. In other words, the ADC driver 810 may act as a signal conditioning element in a data conversion stage and may be a key factor in enabling the ADC 820 to achieve its desired performance. The ADC 820 may be any type of ADC, such as, but not limited to, a successive approximation register (SAR) converter, a pipeline converter, a flash converter, or a sigma-delta converter.

The system 800 shown in FIG. 8 provides just one non-limiting example where current mirror arrangements as described herein may be used and various teachings related to current mirror arrangements with semi-cascoding as described herein are applicable to a large variety of other systems. In some scenarios, various embodiments of current mirror arrangements with semi-cascoding as described herein can be used in automotive systems, safety-critical industrial applications, medical systems, scientific instrumentation, wireless and wired communications, radar, industrial process control, audio and video equipment, current sensing, instrumentation (which can be highly precise), and various digital-processing-based systems. In other scenarios, various embodiments of current mirror arrangements with semi-cascoding as described herein can be used in the industrial markets that include process control systems that help drive productivity, energy efficiency, and reliability. In yet further scenarios, various embodiments of current mirror arrangements with semi-cascoding may be used in consumer applications.

SELECT EXAMPLES

The following paragraphs provide examples of various ones of the embodiments disclosed herein.

Example 1 provides a current mirror arrangement that includes a current mirror circuit and a circuit referred to herein as a "semi-cascoding arrangement." The current mirror circuit includes a transistor Q1 at an input of the current mirror circuit and a transistor Q2 at an output of the current mirror circuit. The semi-cascoding arrangement includes a transistor Q3, a transistor Q4, and a two-terminal passive network PN, including one or more resistors, capacitors, and inductors. Each of the transistors Q1, Q2, Q3, and Q4 has a first terminal, a second terminal, and a third terminal. The first terminal of the transistor Q1 is coupled to the first terminal of the transistor Q2 and to the second terminal of the transistor Q1. The second terminal of the transistor Q2 is coupled to the third terminal of the transistor Q3. The second terminal of the transistor Q3 is coupled to the third terminal of the transistor Q4. The first terminal of the transistor Q3 is coupled to a bias voltage Vref. The first terminal of the transistor Q4 is coupled to a first terminal of the two-terminal passive network PN and a second terminal of the two-terminal passive network PN is coupled to a bias voltage Vref1.

Example 2 provides the current mirror arrangement according to example 1, where the bias voltage Vref and the bias voltage Vref1 are such that a quiescent voltage (i.e., a voltage when no input signal is applied, e.g., when no input signal is applied to the input of the current mirror) between the first and the second terminals of the transistor Q3 is substantially equal to a quiescent voltage between the first and the second terminals of the transistor Q4.

Example 3 provides the current mirror arrangement according to examples 1 or 2, where an impedance of the two-terminal passive network PN is such that a voltage swing at the first terminal of the transistor Q4 is substantially equal to half of a voltage swing at an output of the current mirror arrangement at a given frequency of interest for an input signal to be provided at an input of the current mirror arrangement.

Example 4 provides the current mirror arrangement according to examples 1 or 2, where the current mirror arrangement includes M stages, where M is an integer greater than 1, each stage i of the M stages includes a respective (i.e., a different instance of a) set of a transistor and a two-terminal passive network, where i is an integer between 1 and M (i.e., each of stage 1, . . . , and so on until stage M), and the transistor of each stage i has a first terminal, the second terminal, and a third terminal. For i=1, the transistor of the stage i (i.e., of the stage 1) is the transistor Q4 and the two-terminal passive network of the stage i (i.e., of the stage 1) is the two-terminal passive network PN. For i>1, the first terminal of the transistor of the stage i is coupled to the first terminal of the two-terminal passive network of the stage i, the second terminal of the two-terminal passive network of the stage i is coupled to a respective bias voltage Vrefi of the stage i, and the third terminal of the transistor of the stage i is coupled to the second terminal of the transistor of the stage i−1.

Example 5 provides the current mirror arrangement according to example 4, where, for i<M, the second terminal of the transistor of the stage i is coupled to the third terminal of the transistor of the stage i+1, and the second terminal of the transistor of the stage M is coupled to an output of the current mirror arrangement.

Example 6 provides the current mirror arrangement according to examples 4 or 5, where, for any i between 1 and M, an impedance of the two-terminal passive network of the stage i is such that a voltage swing at the first terminal of the transistor of the stage i is substantially equal to i×VO/(M+1), where VO is a voltage swing at an output of the current mirror arrangement at a given frequency of interest for an input signal to be provided at an input of the current mirror arrangement.

Example 7 provides the current mirror arrangement according to any one of examples 1-6, where, for each of the transistors Q1, Q2, Q3, and Q4, the first terminal is a base terminal, the second terminal is a collector terminal, and the third terminal is an emitter terminal.

Example 8 provides the current mirror arrangement according to example 7, where an emitter area of each of the transistors Q2, Q3, and Q4 is K times of an emitter area of the transistor Q1, where K is a positive number (any number greater than 0). Thus, K is the current gain of the current mirror circuit.

Example 9 provides the current mirror arrangement according to any one of examples 1-6, where, for each of the transistors Q1, Q2, Q3, and Q4, the first terminal is a gate terminal, the second terminal is a drain terminal, and the third terminal is a source terminal.

Example 10 provides the current mirror arrangement according to example 9, where an aspect ratio of each of the transistors Q2, Q3, and Q4 is K times of an aspect ratio of the transistor Q1, where K is a positive number.

Example 11 provides the current mirror arrangement according to any one of the preceding examples, where the second terminal of the transistor Q1 is coupled to the input of the current mirror circuit, and the second terminal of the transistor Q2 is coupled to the output of the current mirror circuit.

Example 12 provides a current mirror arrangement that includes a current mirror circuit and a semi-cascoding arrangement. The current mirror circuit includes a transistor Q1 at an input of the current mirror circuit and a transistor Q2 at an output of the current mirror circuit. The semi-cascoding arrangement includes a transistor Q3, a transistor Q4, and a two-terminal passive network. In such a current mirror arrangement, the transistor Q2 is in a common-emitter configuration, each of the transistor Q3 and the transistor Q4 is in a common-base configuration, an output of the transistor Q2 is coupled to an input of the transistor Q3, an output of the transistor Q3 is coupled to an input of the transistor Q4, an output of the transistor Q4 is coupled to an output of the current mirror arrangement, a base terminal of the transistor Q3 is coupled to a bias voltage Vref, a base terminal of the transistor Q4 is coupled to a first terminal of the two-terminal passive network, and a second terminal of the two-terminal passive network is coupled to a bias voltage Vref1.

Example 13 provides the current mirror arrangement according to example 12, where the bias voltage Vref and the bias voltage Vref1 are such that a quiescent voltage between the base terminal and the output of the transistor Q3 is substantially equal to a quiescent voltage between the base terminal and the output of the transistor Q4.

Example 14 provides the current mirror arrangement according to examples 12 or 13, where the two-terminal passive network includes one or more resistors, capacitors, and inductors.

Example 15 provides the current mirror arrangement according to any one of examples 12-14, where an impedance of the two-terminal passive network is such that a voltage swing at the base terminal of the transistor Q4 is substantially equal to half of a voltage swing at an output of the current mirror arrangement at a given frequency of interest for an input signal to be provided at an input of the current mirror arrangement.

Example 16 provides a current mirror arrangement that includes a current mirror circuit that has a transistor Q1 at an input of the current mirror circuit and a transistor Q2 at an output of the current mirror circuit, a transistor Q3, and a transistor Q4. In such a current mirror arrangement, each of the transistors Q1, Q2, Q3, and Q4 has a first terminal, a second terminal, and a third terminal, an input of the transistor Q3 is coupled to the output of the current mirror circuit, an input of the transistor Q4 is coupled to an output of the transistor Q3, an output of the transistor Q4 is coupled to an output of the current mirror arrangement, and the transistors Q3 and Q4 are configured so that, at a given frequency of interest, a voltage at the first terminal of the transistor Q4 and a voltage at the second terminal of the transistor Q3 changes correspondingly with a change in a voltage at the output of the current mirror arrangement.

Example 17 provides the current mirror arrangement according to example 16, where the transistor Q3 is in a cascode with the transistor Q2.

Example 18 provides the current mirror arrangement according to examples 16 or 17, where the transistor Q4 is in a cascode with the transistor Q3.

Example 19 provides the current mirror arrangement according to any one of examples 16-18, further including a two-terminal passive network, where a first terminal of the two-terminal passive network is coupled to the transistor Q4 and a second terminal of the two-terminal passive network is coupled to a bias voltage Vref1.

Example 20 provides the current mirror arrangement according to example 19, where the transistor Q3 is coupled to a second bias voltage Vref, and the bias voltage Vref and the bias voltage Vref1 are such that a quiescent voltage between a terminal of the transistor Q3 that is coupled to the bias voltage Vref and the output of the transistor Q3 is substantially equal to a quiescent voltage between a terminal of the transistor Q4 that is coupled to the bias voltage Vref1 and the output of the transistor Q4.

Example 21 provides an electronic device that includes an ADC, configured to perform analog-to-digital conversion; and further includes an ADC driver configured to provide a drive signal to the ADC to enable the ADC to perform the analog-to-digital conversion, the ADC driver including the current mirror arrangement according to any one of the preceding examples.

Example 22 provides the electronic device according to example 21, where the electronic device is, or is included in, automatic test equipment, test equipment, military radar/ LIDAR, civil radar/LIDAR, automotive radar/LIDAR, industrial radar/LIDAR, cellular base stations, high speed wireline or wireless communication transceivers, or high speed digital control systems.

Example 23 provides an ADC system that includes an ADC configured to perform analog-to-digital conversion; and an ADC driver configured to provide a drive signal to the ADC to enable the ADC to perform the analog-to-digital conversion, the ADC driver including the current mirror arrangement according to any one of the preceding examples.

In other embodiments, the current mirror arrangement according to any one of the preceding examples may be incorporated in other kinds of components of an electronics device, besides being included in an ADC driver. Examples of other components where the current mirror arrangement according to any one of the preceding examples may be incorporated include amplifiers, mixers, and filters, e.g., high-speed amplifiers, high-speed mixers, and high-speed filters. In turn, such components may be included in devices such as automatic test equipment, test equipment, military radar/LIDAR, civil radar/LIDAR, automotive radar/LIDAR, industrial radar/LIDAR, cellular base stations, high speed wireline or wireless communication transceivers, or high speed digital control systems.

The invention claimed is:

1. An electronic device, comprising a current mirror arrangement, the current mirror arrangement including:
   a current mirror circuit, comprising a first transistor at an input of the current mirror circuit and a second transistor at an output of the current mirror circuit;
   a third transistor;
   a fourth transistor; and
   a two-terminal passive network,
   wherein:
      each of the first, second, third, and fourth transistors has a first terminal, a second terminal, and a third terminal,
      the first terminal of the first transistor is coupled to the first terminal of the second transistor and to the second terminal of the first transistor,
      the second terminal of the second transistor is coupled to the third terminal of the third transistor,
      the second terminal of the third transistor is coupled to the third terminal of the fourth transistor,
      the first terminal of the third transistor is coupled to a first bias voltage,
      the first terminal of the fourth transistor is coupled to a first terminal of the two-terminal passive network and a second terminal of the two-terminal passive network is coupled to a second bias voltage,
      the first terminal of the fourth transistor is not coupled to a grounding capacitor, and
      at a target frequency, an impedance of the two-terminal passive network is such that a voltage swing at the first terminal of the fourth transistor is substantially equal to half of a voltage swing at an output of the current mirror arrangement.

2. The electronic device according to claim 1, wherein the first bias voltage and the second bias voltage are such that a quiescent voltage between the first and the second terminals of the third transistor is substantially equal to a quiescent voltage between the first and the second terminals of the fourth transistor.

3. The electronic device according to claim 1, wherein the current mirror arrangement includes M stages, where:

M is an integer greater than 1,
each stage i of the M stages includes a respective set of a transistor and a two-terminal passive network, where i is an integer between 1 and M,
for i=1, the transistor of the stage i is the fourth transistor and the two-terminal passive network of the stage i is the two-terminal passive network, and
for i>1:
   the first terminal of the transistor of the stage i is coupled to the first terminal of the two-terminal passive network of the stage i,
   the second terminal of the two-terminal passive network of the stage i is coupled to a bias voltage i of the stage i, and
   the third terminal of the transistor of the stage i is coupled to the second terminal of the transistor of the stage i−1.

4. The electronic device according to claim 3, wherein:
for i<M, the second terminal of the transistor of the stage i is coupled to the third terminal of the transistor of the stage i+1, and
the second terminal of the transistor of the stage M is coupled to an output of the current mirror arrangement.

5. The electronic device according to claim 3, wherein, for any i between 1 and M, an impedance of the two-terminal passive network of the stage i is such that a voltage swing at the first terminal of the transistor of the stage i is substantially equal to $i \times VO/(M+1)$, where VO is a voltage swing at an output of the current mirror arrangement.

6. The electronic device according to claim 1, wherein, for each of the first, second, third, and fourth transistors, the first terminal is a base terminal, the second terminal is a collector terminal, and the third terminal is an emitter terminal.

7. The electronic device according to claim 6, wherein an emitter area of at least one of the second, third, and fourth transistors is K times of an emitter area of the first transistor, where K is a positive number.

8. The electronic device according to claim 1, wherein, for each of the first, second, third, and fourth transistors, the first terminal is a gate terminal, the second terminal is a drain terminal, and the third terminal is a source terminal.

9. The electronic device according to claim 8, wherein an aspect ratio of at least one of the second, third, and fourth transistors is K times of an aspect ratio of the first transistor, where K is a positive number.

10. The electronic device according to claim 1, wherein:
the second terminal of the first transistor is coupled to the input of the current mirror circuit, and
the second terminal of the second transistor is coupled to the output of the current mirror circuit.

11. The electronic device according to claim 1, wherein the target frequency is a frequency of a signal at the second terminal of the fourth transistor.

12. The electronic device according to claim 1, wherein the electronic device is a system that includes an analog-to-digital converter (ADC) and a driver for the ADC, and wherein the current mirror arrangement is a part of the driver for the ADC.

13. The electronic device according to claim 1, wherein the electronic device is a driver for an analog-to-digital converter.

14. A electronic device, comprising a current mirror arrangement, the current mirror arrangement including:
   a current mirror circuit, comprising a first transistor at an input of the current mirror circuit and a second transistor at an output of the current mirror circuit;
   a third transistor;

a fourth transistor; and
a two-terminal passive network,
wherein:
the second transistor is in a common-emitter configuration,
each of the third transistor and the fourth transistor is in a common-base configuration,
an output of the second transistor is coupled to an input of the third transistor,
an output of the third transistor is coupled to an input of the fourth transistor,
an output of the fourth transistor is coupled to an output of the current mirror arrangement,
a base terminal of the third transistor is coupled to a first bias voltage,
a base terminal of the fourth transistor is coupled to a first terminal of the two-terminal passive network and is not coupled to a capacitor that is coupled to a ground potential,
a second terminal of the two-terminal passive network is coupled to a second bias voltage, and
an impedance of the two-terminal passive network is such that a voltage swing at the base terminal of the fourth transistor is substantially equal to half of a voltage swing at the output of the fourth transistor.

15. The electronic device according to claim 14, wherein the first bias voltage and the second bias voltage are such that a quiescent voltage between the base terminal and the output of the third transistor is substantially equal to a quiescent voltage between the base terminal and the output of the fourth transistor.

16. The electronic device according to claim 14, wherein the two-terminal passive network includes one or more resistors, capacitors, and inductors.

17. The electronic device according to claim 14, wherein an impedance of the two-terminal passive network is such that a voltage swing at the base terminal of the fourth transistor is substantially equal to half of a voltage swing at an output of the current mirror arrangement.

18. The electronic device according to claim 14, wherein the electronic device is a system that includes an analog-to-digital converter (ADC) and a driver for the ADC, and wherein the current mirror arrangement is a part of the driver for the ADC.

19. The electronic device according to claim 14, wherein the electronic device is a driver for an analog-to-digital converter.

20. An electronic device, comprising a current mirror arrangement, the current mirro arrangement including:
a current mirror circuit, comprising a first transistor at an input of the current mirror circuit and a second transistor at an output of the current mirror circuit;
a third transistor, coupled to a first bias voltage;
a fourth transistor; and
a two-terminal component, where a first terminal of the two-terminal component is coupled to the fourth transistor and a second terminal of the two-terminal component is coupled to a second bias voltage,
wherein:
an input of the third transistor is coupled to the output of the current mirror circuit,
an input of the fourth transistor is coupled to an output of the third transistor,
an output of the fourth transistor is coupled to an output of the current mirror arrangement, and
the first bias voltage and the second bias voltage are such that a quiescent voltage between a terminal of the third transistor that is coupled to the first bias voltage and the output of the third transistor is substantially equal to a quiescent voltage between a terminal of the fourth transistor that is counted to the first terminal of the two terminal component and the output of the fourth transistor.

21. The electronic device according to claim 20, wherein the third transistor is in a cascode with the second transistor.

22. The electronic device according to claim 20, wherein the fourth transistor is in a cascode with the third transistor.

23. The electronic device according to claim 20, wherein the third and fourth transistors are configured so that a voltage at the terminal of the fourth transistor that is coupled to the first terminal of the two-terminal component and a voltage at the second terminal of the third transistor change correspondingly with a change in a voltage at the output of the current mirror arrangement.

24. The electronic device according to claim 20, wherein the terminal of the fourth transistor that is coupled to the first terminal of the two-terminal component is not coupled to a grounding capacitor.

25. The electronic device according to claim 20, wherein the electronic device is a system that includes an analog-to-digital converter (ADC) and a driver for the ADC, and wherein the current mirror arrangement is a part of the driver for the ADC.

26. The electronic device according to claim 20, wherein the electronic device is a driver for an analog-to-digital converter.

* * * * *